United States Patent [19]

Zavracky et al.

[11] Patent Number: 4,614,119

[45] Date of Patent: Sep. 30, 1986

[54] RESONANT HOLLOW BEAM AND METHOD

[75] Inventors: Paul M. Zavracky, Norwood; Stephen D. Senturia, Boston; Richard H. Morrison, Jr., Taunton, all of Mass.

[73] Assignee: The Foxboro Company, Foxboro, Mass.

[21] Appl. No.: 709,870

[22] Filed: Mar. 8, 1985

[51] Int. Cl.[4] .................. G01L 11/00; H01L 21/306; B44C 1/22; C23F 1/02
[52] U.S. Cl. ......................... 73/704; 73/715; 73/754; 156/628; 156/630; 156/633; 156/634; 156/647; 156/656; 156/657; 156/651; 156/662

[58] Field of Search .............. 357/26, 29, 30; 156/628, 629, 630, 633, 634, 647, 651, 656, 659.1, 661.1, 657, 662; 148/1.5, 187; 29/572, 580; 73/700, 702, 704, 708, 715, 753, 754, 756, 726, 727

[56] References Cited

U.S. PATENT DOCUMENTS

| | | | |
|---|---|---|---|
| 4,071,838 | 1/1978 | Block | 156/647 X |
| 4,293,373 | 10/1981 | Greewood | 156/647 X |
| 4,472,239 | 9/1984 | Johnson et al. | 156/647 |
| 4,507,170 | 3/1985 | Myhre | 156/633 |

*Primary Examiner*—William A. Powell
*Attorney, Agent, or Firm*—Terrence Martin; Jack H. Wu; William E. Meyer

[57] ABSTRACT

A microminiature resonant hollow beam sensor is manufactured by micromachining and microfabrication techniques. Specifically, a sensor is formed by etching troughs in a pair of silicon substrates, joining the substrates face-to-face, and etching away unwanted material to free the resonant hollow beam sensors.

54 Claims, 11 Drawing Figures

RESONANT HOLLOW BEAM AND METHOD

TECHNICAL FIELD

The present invention relates to sensor apparatus for measuring the parameters of physical phenomena and a method for making such sensors. More particularly, the invention relates to microminiature sensor elements having a resonant frequency which varies when subjected to certain physical phenomena.

BACKGROUND ART

It is an important purpose of the invention to provide a small transducer capable of relating a pressure force to a frequency, which may be regulated or generated by light, pneumatic, acoustic, or electrical energy or the equivalents. For the purposes of simplicity and ease of reference, the process will be referred to herein as pressure-to-frequency conversion, but the generic conception for which patent protection is sought includes all physical phenomena which are capable of conversion to a pressure communicable to a resonant hollow beam structure. In general, a measurand is the physical phenomena, i.e., physical quantity, force, property, or condition, which is being measured. Common measurands in the process control industry include flow rate, pressure and differential pressure, level, temperature, and analytical measurements such as pH, oxidation reduction potential (ORP), conductivity, and the like. It is useful to recognize that various physical phenomena may be converted to pressure or pressure variations, including thermal measurands, radiation measurands, force measurands, rate measurands, quantity measurands, specific physical property measurands and electrical measurands.

Among the pressure-to-frequency schemes presently known are the Patents to Ferran et al, U.S. No. 3,187,579; to Cooiman, U.S. No. 3,327,533, and U.S. No. 3,257,850; to Hobbs, U.S. No. 2,466,809; and U.S. No. 3,831,137 to Cuomo. Other vibratable element sensors include vibrating tensioned wire systems as are illustrated by U.S. Pat. Nos. 4,164,651 and 4,149,422.

Common to all of the foregoing are limitations of space due to the large size of the sensing elements, and complexity of the assembled sensor. Also, the prior art is often lacking in flexibility as to the forms of energy powering the oscillatory mechanism and the form of energy by which the resonant frequency is sensed. The present invention comprehends a microstructural resonant hollow cavity beam sensor, and the microfabrication or micromachining process by which it is manufactured. These fabrication techniques permit fabricating large quantities of the sensor at low labor cost and with extremely consistent operating characteristics.

Ordinary and conventional miniaturization techniques enable, with the exercise of considerable care, patience, and skill, the manufacture of hollow resonant elements as small as about ten times greater than this invention (e.g., about one-half inch long). Different materials are used (steel sheet metal); the micro-size resonant element envisioned by the present invention cannot readily be made by such conventional miniaturization techniques.

Two published articles which are especially useful in describing microfabrication and micromachining techniques are K. E. Peterson, "Silicon as a Mechanical Material", *Proceedings of the IEEE*, Vol. 70, No. 5, May 1982, pp. 420–457 and J. B. Angell, S. C. Terry, and P. W. Barth, "Silicon Micromechanical Devices", *Scientific American*, Vol. 248, No. 4, April 1983, pp. 44–55.

DISCLOSURE OF INVENTION

The present micro-size resonant hollow cavity beam microsensor is produced by preparing two base structure blanks, which may be of silicon or equivalent material, etching in the front face surface of the first blank a prescribed size and shape first closed-ended trough for the hollow beam and a second open-ended communicating trough for a passageway, and etching in the second blank a mirror- or complementary-image pair of matching troughs. Multiple patterns may be prepared on each blank to increase productivity. A reverse face etch mask is applied to the back of each blank. The two front face surfaces are then prepared for selective etching by doping areas of the exposed troughs to provide an etch stop region for the hollow beam. In a preferred embodiment, a narrow surface area adjacent the trough is also doped. By doping a narrow area adjacent to the troughs, a greater surface area for bonding is formed, which fortuitously improves stability of the finished beam. The two base structures are then joined in registration and bonded together to form a united base structure. Note that beams of differing cross section may be formed by etching the troughs along differing cyrstallographic planes. Next, anisotropic etching relieves the closed-ended hollow beam from the bulk of the united base structure, stopping at the doped region. The relieved hollow cavity resonant beam resulting is sealed and cantilevered, with a sealed communicating passageway to the edge of the base structure for application of pressure to the resonant element.

In alternate embodiments, the doping step is replaced by a metallization step, or by forming a silicide layer. In the later case, the silicide is formed by depositing the metal on a silicon substrate and then sintering it. Suitable metal depositions, especially for siliciding, include tantalum, titanium, tungsten, chromium, molybdenum, and nickel. Platinum and other materials also work well.

In use, the resonant hollow cavity beam element is pressurized, the pressure being related to the physical phenomena being measured. The resonant hollow beam is set into oscillatory motion, and the oscillatory resonant frequency, which is related to the pressure applied, is detected and measured. Oscillation can be initiated and sustained by electrical, acoustic, pneumatic, or radiant (light) energy supplied either locally or from an external or remote source. In the event acoustic energy is the physical phenomena to be measured, an external energy source for oscillation purposes is usually not needed if the acoustic energy is coupled directly to the pressurized resonant hollow beam and the variations are measured remotely. In many instances, however, energy is required to initiate and/or sustain oscillation of the beam. Often local vibrations at the site of the sensor are sufficient to initiate vibration. Fiber optic methods and apparatus are ideally suited to measuring the vibratory frequency, in any of the known schemes. Similarly, conventional electronic methods and apparatus may be used to detect and measure the vibration frequency. Such measurement of the vibration frequency may be made locally or remotely regardless of whether optical or electronic means are used to detect the vibration frequency.

It is an advantage of the article of the invention that extremely small sensors may be built. Another advantage of the invention is that extremely low power levels are required to initiate and sustain oscillation of the device. Still another advantage of the invention is that various energy sources may be utilized to power the device, including light, electrical or pneumatic energy, and acoustic energy coupled to the sensor. This results in great flexibility in adapting this newer technology into various older process control systems and allows anticipation of advancing future technology. Yet another advantage of this invention is that vast quantities of sensor elements may be manufactured with little or no variation among them, at low labor costs. A further object of the invention is to provide a high-reliability, highly accurate sensor exhibiting improved measurement repeatability characteristics.

BRIEF DESCRIPTION OF DRAWINGS

Numerous other features and advantages of the invention disclosed herein will be apparent upon examination of the several drawing figures forming a part hereof. Broken lines indicate hidden portions of the device being illustrated in certain views, and are included to clearly show features otherwise obstructed. In all views, like reference characters indicate corresponding parts.

BEST MODE FOR CARRYING OUT THE INVENTION

Figure 1:
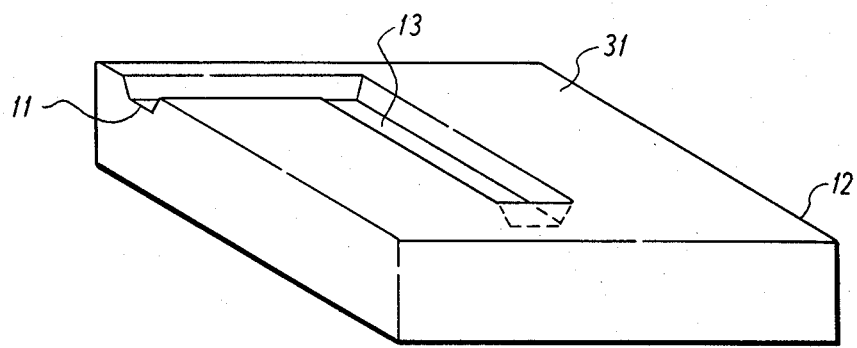
FIG. 1 is a perspective view of one of the substrate portions.
Figure 1A:
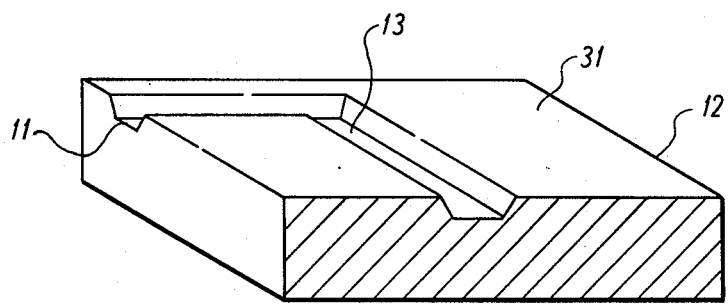
FIG. 1A is a perspective view showing a cross section portion of one of the substrate portions after etching a beam trough and the communicating passageway trough therein (the beam closed end is not shown)

Referring now to the drawings, especially FIGS. 1 and 1A, there is shown a communicating passageway trough 11 in a first base structure substrate portion 12 which includes a hollow beam trough 13. Both of the troughs are etched into the front face surface 31 of the substrate. The trough outlines are joined, and may have an irregular half-hexagonal, round, or other cross-section, as will be further described hereinafter. The reverse face side of the substrate 12 (i.e., the opposite side 32 from the front face side 31; see FIG. 4) must be masked appropriately for etching from the reverse side. Substrate 12 is silicon oriented to the crystallographic (100) plane in this preferred embodiment. By etching the troughs along differing crystallographic planes and/or using conventional etching and/or metallization methods, beams of differing cross section may be formed. Equivalent materials may be substituted for silicon.

Figure 2:
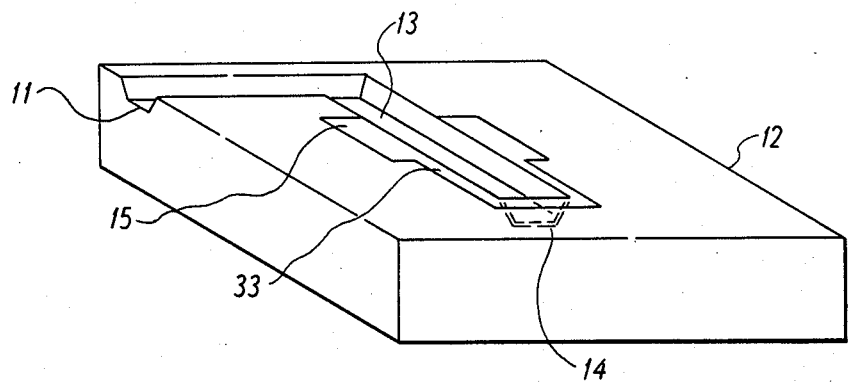
FIG. 2 is a perspective view as in FIG. 1, and additionally showing certain regions of the beam trough after doping.
Figure 2A:
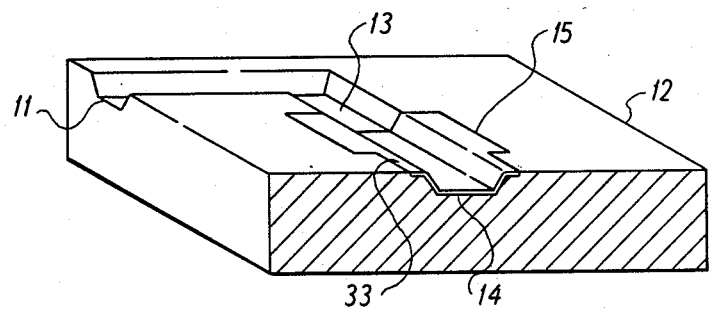
FIG. 2A is a perspective view as in FIG. 1A.
Figure 2B:
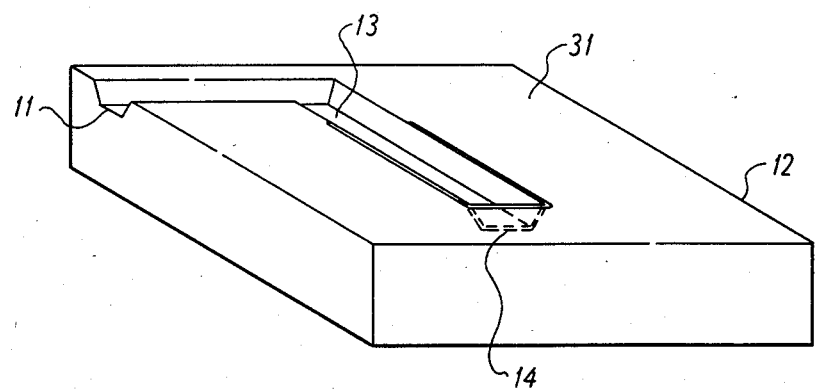
FIG. 2B is an alternate embodiment omitting the beams wings and extra joining surface area.
Figure 2C:
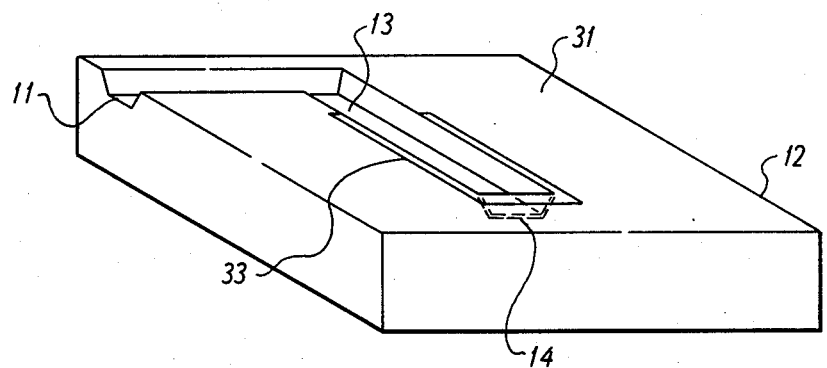
FIG. 2C is an alternative embodiment omitting the beam wings and including the extra joining surface area.

Turning now to FIGS. 2 and 2A, there is shown the first base structure 12 of FIGS. 1 and 1A, on which the further step of doping certain areas 14, 15, 33 of the hollow beam trough 13 has been performed. Doped area 33 is a narrow strip area provided to ensure a complete hermetic seal of the beam. FIG. 2B illustrates an alternate embodiment in which the beam wings (15 of FIG. 2) are omitted. Additionally, in some applications or when using certain materials or joining methods, it may be desirable to omit the narrow strip doped area (33 of FIG. 2) adjacent the beam, provided a hermetic seal can be accomplished. Similarly, the doped wide wing area adjacent the beam may be omitted, if desired, when the narrow strip is required to achieve a perfect seal; this is shown in FIG. 2C.

Figure 3:
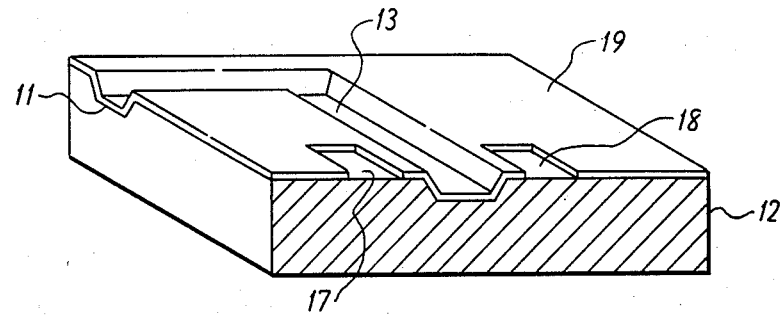
FIG. 3 is a perspective view as in FIG. 1A, and additionally showing certain regions of the beam trough after metallization.

In an alternate embodiment, see FIG. 3, a metallization layer 19 is deposited onto the exposed substrate surface, including the troughs 11, 13. Alternatively, a silicide layer may be formed on the surface of the substrate 12 if silicon is used as the substrate material. Silicides are formed by metal deposition on a silicon substrate and sintered to form the silicide layer. Subsequently, a pair of "window areas" 17, 18 are etched into selected portions of the metallization of silicide layer adjacent the desired resonant hollow beam portion. The remaining process steps of joining, bonding, and final etching remain substantially the same as for doped trough areas, except as hereinafter described. Suitable metal depositions, expecially for silicides, include tantalum, titanium, tungsten, chromium, molybdenum, and nickel. Additionally, beams may be formed of beryllium copper, aluminum, steel, or plastics. Platinum also works well. A second, mirror- or complementary-image substrate is prepared next, including the step of etch masking the reverse face side.

The two substrate pieces may be joined in several ways, including soldering, electromigration, anodic bonding, adhesives, or aluminum diffusion bonding. Aluminum diffusion bonding requires, as a substep of the bonding process, deposition of a superficial metallic layer. Thermomigration bonding is fully described in "Joining and Recrystallizaton of Si using the Termomigration Process," by T. Mizrah, *Journal of Applied Physics* 51 (2), Feb. 1980, pp. 1207–1210. The bonding process must be compatible with the selected beam material.

Figure 4:
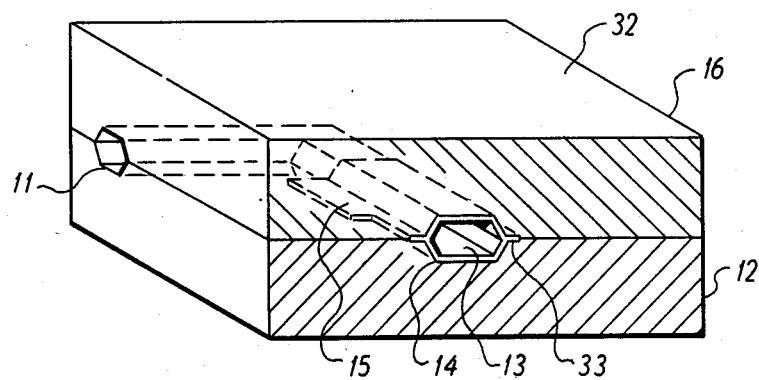
FIG. 4 is a perspective view of the substrate portion of FIG. 2A, joined in registration with a mirror- or complementary-image substrate portion, and including dotted lines to show the hidden communicating passageway and the cavity of the hollow beam.

Both substrate portions 12 and 16 are shown in FIG. 4 is cross section. They are shown joined together at their mututal front faces, and include the completed communicating passageway trough 11, the closed-end hollow beam trough 13 and associated doped areas 14, 15. The metallized area 19 is shown in FIG. 3. Note that the doped or metallized area adjacent the trough proper preferably includes a narrow edge portion 33 parallel the full length of the trough, including the closed end of the beam trough (see also FIG. 5A), and optionally includes a wider portion 15 (FIGS. 2, 2A) parallel to at least a portion of the trough. In the completed resonant hollow beam, the inclusion of the narrow portion 33 ensures a complete hermetic seal of the beam, and the wider, wing-like portion 15 serves to stabilize oscillation of the beam and protects the relatively delicate beam from excess shock and vibration. Reverse face mask 32 is shown in this view prior to final removal of excess material.

Figure 5:
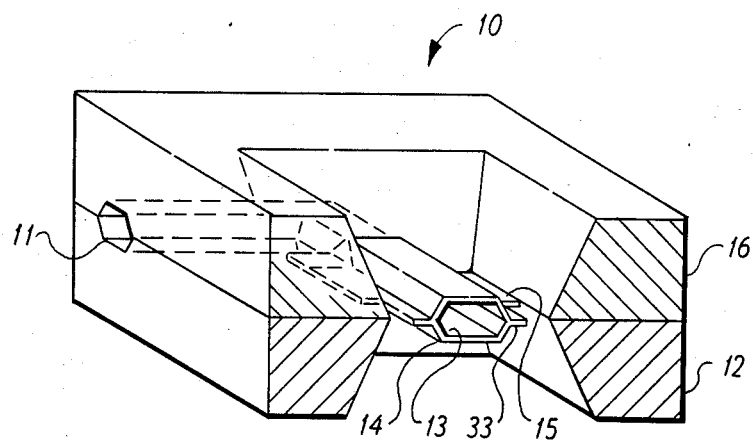
FIG. 5 is a perspective view of the resonant hollow beam device, in cross section, after anisotropic etching to relieve the hollow beam element.
Figure 5A:
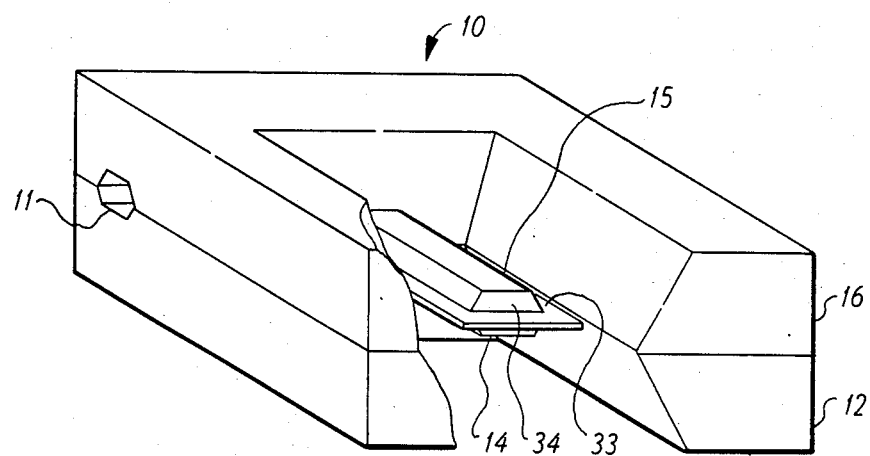
FIG. 5A is a perspective view of the resonant hollow beam device after anisotropic etching to relieve the hollow beam per se, showing the closed end of the beam.

FIGS. 5 and 5A show the completed doped version of the resonant hollow beam sensor element 10, including the previously identified portions 11, 12, 13, 14, 15, 16, and 33. Note in FIG. 5A the closed end 34 of the resonant hollow beam. The metallized version looks substantially identical.

Figure 6:
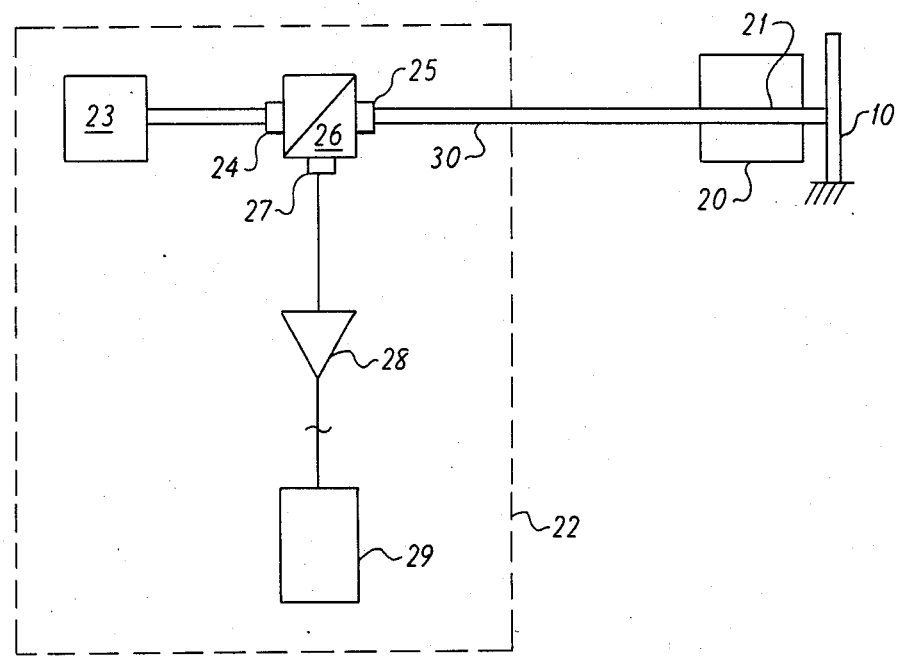
FIG. 6 shows an example of remote detecting and frequency measurement of a vibrating resonant hollow beam.

Referring now to FIG. 6, the sensor 10 of the invention is schematically shown with an exemplary optical system 22 which operates as described hereinafter. A power supply 23 provides voltage to a light-emitting diode (LED) 24 or the equivalent. Means to convert supply energy to a radiant energy form such as a beam of light, and to communicate it to the sensor via an optical fiber through a beam splitter 26, are known in the art. The light energy emitted by the LED is generated using conventional circuits (which are not depicted) in either a continuous or pulsed (or other modulation) fashion, as is suitable to the particular application. Beam splitter 26 is so designed that for a given magnitude of light energy incident from the source direction, at least a portion thereof is transmitted straight through the beam splitter 26 to a lens 25, and some portion of the light energy may be diverted. Lens 25 concentrates the transmitted portion of the light (or radiant energy) into the attached optical fiber pathway 30, the fiber end portion 21 is fixed within a clamp means 20 adjacent the resonant hollow beam sensor element 10 of the invention. The light is thus directed by the optical fiber onto the rapidly vibrating element 10.

As the oscillating element 10 alternately moves toward and then away from the fiber end 21, the intensity of the light reflected by the surface of the resonant hollow beam element 10 varies periodically and in relation to the vibration frequency. The resonant hollow beam preferably includes a flat surface for this application. A fluid pressure (not shown) applied to the interior cavity of the resonant hollow beam, and related to the measurand, varies the resonant frequency of the hollow beam element 10. The vibration frequency is thus related to the physical phenomena being measured. This varied, or intensity-modulated light is reflected back along the fiber optic path 30 to the beam splitter 26 where a portion of the returned light energy is directed onto a photodetector 27 or an equivalent radiant-energy-to-electrical-energy transducer. The photodetector converts the variable intensity light energy beam into an electrical signal, the magnitude of which varies in relation to the oscillatory and modulated light frequencies. The photodetector 27 electrical output is optionally amplified by gain block (amplifier) 28 and thence sent to a conventional electrical circuit 29 which correlates the electrical output frequency to the magnitude of the physical parameter being measured.

The resonant hollow beam sensor element 10 is prepared by conventional microfabrication and micromachining techniques known in the semiconductor manufacturing art. The described embodiments are particularly well suited to be batch-manufactured. More particularly, micromachining includes the techniques of planar technology, wet chemical etching and other etching techniques, metallization, and metal deposition. Planar technology includes the various techniques used in integrated circuit fabrication, such as photolithography, oxide etching, thermal diffusion, ion implantation, chemical vapor deposition, and dry plasma etching. Bonding techniques include chemical, metallurgical, and adhesive bonding, as by bonding agents, and more specifically includes soldering, electromigration, thermomigration, and die bonding, adhesives, and aluminum diffusion bonding, to be selected according to the beam and substrate materials.

A specific procedure for manufacturing these resonant hollow beam sensors by microfabrication and micromachining techniques is as follows:

1. Prepare suitable etchable substrates of a material, such as silicon. Silicon substrate material should be oriented to the crystallographic (100) plane.

2. An outline mask of the desired beam and passageway troughs is patterned onto the face surface of the first substrate using conventional photolithographic materials and methods.

3. An additional area on the reverse face surface of the substrate is masked appropriately for later etching from the reverse side (step 8). Depending on the materials selected and the etchant used, the reverse face mask is applied to limit the etching field. Precise front-to-back mask alignment is required.

4. Etch the troughs to the desired depth using conventional etching techniques. Anisotropic etching, generally preferred for directionality, may be used to give suitable predictable topographic features. The trough depth is typically of a range between $4 \times 10^{-7}$ and $2 \times 10^{-3}$ meters. Suitable cantilever resonant hollow beam sensors have been made having the trough depths substantially within a range of $5 \times 10^{-6}$ to $2 \times 10^{-5}$ meters. Various trough cross sections may be etched, generally limited by the kind and activity of the etchant. Each trough cross section will form one-half the final beam cross section. Different etching procedures can result in different beam cross sections.

5. Repeat steps 1–4 preparing mirror- or complementary-image second substrates including reverse face etch masking.

6. Next, the substrate trough areas are doped to predetermined etch stop depths. Boron nitride and boric oxide ($B_2O_3$) are suitable dopant sources; the equivalents thereof may be substituted. A suitable etch stop layer may be formed of boron doped silicon, with a typical desired wall thickness less than $10^{-5}$ meters, preferably about $3-10^{-6}$ meters. The doping is achieved by conventional means, including thermal diffusion, ion implantation, and the equivalents thereof, which techniques are known micro-fabrication/micromachining processes. Typical trough widths could be less than that necessary to produce free beam widths, which is $10^{-3}$ meters wide, with lengths less than $6 \times 10^{-3}$ meters. The trough should be at least twice as long as the free beam length and its width must be smaller than the width of the free beam width, allowing room for a bond region to surround the hollow beam section.

7. The first and (mirror- or complementary-image) second substrates are then joined face to face, aligned in precise registration, and bonded together, as by electromigration, anodic bonding, aluminum diffusion bonding, adhesives, or other equivalent known bonding techniques.

8. The undoped substrate material is then removed from around the doped substrate portions by etching through the reverse face mask to leave a relieved, hollow microstructural cantilever beam.

9. Finally, the individual sensors are separated (if produced in multiples), then washed, dried, and placed in suitable storage containers.

An alternate procedure, for manufacturing metallic resonant hollow beam sensors by microfabrication and micromachining techniques, is as follows:

1. Prepare suitable etchable substrates of a material, such as silicon. Silicon substrate material should be oriented to the crystallographic (100) plane.

2. An outline mask of the desired beam and passageway troughs is patterned onto the front face surface of the first substrate using conventional photolithographic materials and methods.

3. An additional area on the reverse face surface of the substrate is masked appropriately for later etching from the reverse side (step 10). Depending on the materials selected and the etchant used, the reverse face etch mask is applied to limit the etching field. Precise front-to-back mask alignment is required.

4. The troughs are etched to the desired depth using conventional etching techniques. Anisotropic etching, generally preferred for the directionality, may be used to give appropriate predictable topographic features. The trough depth is typically of a range between $4 \times 10^{-7}$ and $2 \times 10^{-3}$ meters. Suitable cantilever resonant hollow beam sensors should have trough depths preferably and substantially within a range of $5 \times 10^{-6}$ to $2 \times 10^{-5}$ meters. Various trough cross sections may be etched, generally limited by the kind and activity of the etchant. Each trough cross sectin will form one-half the final beam cross section. Different etching procedures can result in different beam cross sections.

5. The face etch masking material is removed and the face surface of the substrate is prepared for metallization. Using photolithographic techniques, small window areas adjacent the trough are defined and created in the metallic layers to outline the cantilever beam portion and facilitate later etching to relieve the beam (step 10).

6. Repeat steps 1-5 preparing mirror- or complementary-image second substrates including reverse face etch masking.

7. The selected metal is then deposited by any suitable one of the known metallization techniques, including vacuum deposition, plating, chemical vapor deposition, and the like. Suitable metals, especially for forming silicides, include nickel, chromium, tantalum, molybdenum, platinum, and titanium. Metal beams can also be formed of beryllium copper, aluminum, or steel. Plastics could also be substituted for the metallization. The selection of materials for the metallization (or plastics deposition) is dependent on the substrate and the etchants to be used; e.g., the etchant should etch the substrate but not the deposition layer. The thickness of the deposition layer should fall within the range of $4 \times 10^{-7}$ to $2 \times 10^{-3}$ meters, preferably $5 \times 10^{-6}$ to $2 \times 10^{-5}$ meters.

8. Next, a bonding layer is applied to the deposition layer. Suitable bonding agents include solder, glasses, or the like. The bonding layer is preferably patterned along with the beam material and may extend partially into the center of the beam. The thickness of the bonding layer should be minimized. $10^{-7}$ meters may be a thickness limit for some bonding agents, as the bonding layer may affect the operation of the beam. The bonding layer must be compatible with the deposition layer and the etchants used to free the beam (step 10).

9. The first and (mirror- or complementary-image) second substrates are then joined face to face, aligned in precise registration, and bonded together by conventional techniques, including soldering (and equivalent melt bonding agents), diffusion bonding, glass fritting (which may be silk screened onto the substrates), Mallory (or electrostatic) bonding or the equivalents. Note that the temperature of the bonding must be compatible with the beam and substrate materials.

10. Portions of the substrate material are then removed from around the metallized trough portions by etching through the reverse face mask to leave a relieved, hollow microstructural metal cantilever beam.

11. Finally, the individual sensors are separated (if produced in multiples), then washed, dried, and placed in suitable storage containers.

Although the physical embodiment of the present invention has been described in terms of preferred embodiments shown in the illustrative figures, certain modifications and changes may now become apparent to those skilled in the art, based on the present disclosure. For example, modification of the drive scheme shown in FIG. 6 may be envisioned, as well as numerous other schemes for driving the resonant hollow beam element into vibration and for detecting the frequency of oscillation, as by either optical or non-optical means. Nevertheless, it is intended that such modifications shall be encompassed within the scope of the hereinafter appended claims.

We claim:

1. In the manufacture of small resonant sensor elements, the method of manufacturing resonant hollow microstructural beam sensors comprising:
    (a) etching a trough in the front face surface of a first substrate;
    (b) etching a complementary-image trough in the front face surface of a second substrate;
    (c) doping the trough areas of said first and second substrates to a predetermined etch-stop depth;
    (d) aligning the first and second substrates in precise registration with their respective front face surfaces joined;
    (e) bonding said joined front face substrate surfaces together; and
    (f) etching sufficient undoped substrate away from the doped substrate region to relieve the doped portion from the remaining substrate material, and leave a relieved, hollow microstructural cantilever beam.

2. The method of claim 1 including performing the additional step of depositing an etch stop on the reverse face surfaces of the respective substrates prior to step (f) to restrict the etching process in relieving the beam.

3. The method of claim 1 in which the substrate material is silicon.

4. The method of claim 1 in which the dopant source includes boron.

5. The method of claim 1 in which the doping is effected by ion implantation.

6. The method of claim 1 in which the joined substrate front face surfaces are bonded by electromigration.

7. The method of claim 1 in which the joined substrate front face surfaces are bonded by anodic bonding.

8. The method of claim 1 in which the joined front face substrates are bonded by aluminum diffusion bonding.

9. The method of claim 1 in which each trough is etched to a depth substantially within a range of $4 \times 10^{-7}$ meters and $2 \times 10^{-3}$ meters.

10. The method of claim 1 in which each etched trough depth is substantially within a range of $5 \times 10^{-6}$ meters and $2 \times 10^{-5}$ meters.

11. A resonant hollow microstructural cantilever beam sensor element formed by the process of:
 (a) etching a trough in the front face surface of a first substrate;
 (b) etching a complementary-image trough in the front face surface of a second substrate;
 (c) doping the trough areas of said first and second substrates to a predetermined etch-stop depth;
 (d) aligning the first and second substrates in precise registration with their respective front face surfaces joined;
 (e) bonding said joined front face substrate surfaces together; and
 (f) etching the undoped substrate from the doped substrate region to relieve the beam from the remaining substrate material.

12. A resonant hollow microstructural cantilever beam sensor element formed by the method of claim 11 and including performing the additional step of depositing an etch stop to the reverse face surfaces of the respective substrates prior to step (f) to restrict the etching process in relieving the beam.

13. The product according to claim 11 in which the substrate material is silicon.

14. The product according to claim 11 in which the doping source includes boron.

15. The product according to claim 11 in which the doping is effected by ion implantation.

16. The product according to claim 11 in which the joined front face substrate surfaces are bonded by electromigration.

17. The product according to claim 11 in which the joined front face substrate surfaces are bonded by anodic bonding.

18. The product according to claim 11 in which the joined front face substrates are bonded by aluminum diffusion bonding.

19. The product according to claim 11 in which each etched trough depth is substantially within a range of $4 \times 10^{-7}$ meters and $2 \times 10^{-3}$ meters.

20. The product according to claim 11 in which each etched trough depth is substantially within a range of $5 \times 10^{-6}$ meters and $2 \times 10^{-5}$ meters.

21. A microstructural resonant hollow beam sensor comprising a closed cantilevered hollow cavity beam element having top, bottom, closed end and at least two side walls joined from at least two substrate pieces and a base structure to which said resonant hollow cavity beam element is attached, said base structure including a sealed, fluid-communicating passageway between said resonant hollow beam element cavity and an outside surface of said base structure, and in which said resonant hollow cavity beam element is less than $10^{-1}$ meters wide, less than $6 \times 10^{-1}$ meters long, less than $4 \times 10^{-3}$ meters thick, and the beam wall thicknesses are less than $2 \times 10^{-4}$ meters thick.

22. The sensor of claim 21 in which the resonant hollow cavity beam element is less than about $10^{-3}$ meters wide, less than about $10^{-3}$ meters long, less than about $3 \times 10^{-5}$ meters thick, and has a wall thickness of less than about $6 \times 10^{-5}$ meters.

23. The sensor of claim 21 in which the base structure is formed of silicon.

24. The sensor of claim 21 in which the hollow cavity beam is formed of first and second portions and said base structure is formed of first and second base structure portions, said first beam portion and said first base portion being unitary, and said second beam portion and said second base portion being unitary.

25. The sensor of claim 21 in which the hollow beam cavity has been formed from silicon-base material doped to create an etch-stop layer.

26. The sensor of claim 21 further characterized in that the resonant hollow cavity beam element is curvilinear in cross section.

27. The sensor of claim 21, further characterized in that the resonant hollow cavity beam element is polygonal having at least 3 sides in cross section.

28. The sensor of claim 21, further characterized in that substantially flat, wing elements are formed along at least a portion of the sides of the resonant hollow cavity beam, extending lengthwise from the base structure.

29. In the manufacture of small resonant sensor elements, the method of manufacturing resonant hollow microstructural beam sensors comprising:
 (a) etching a trough in the front face surface of a first substrate;
 (b) etching a complementary-image trough in the front face surface of a second substrate;
 (c) depositing a conformal metallization layer over the respective substrate front face surface areas of the first and second substrates, including the trough surfaces;
 (d) removing from the front face surface of each of the substrates a window area in the metallization layer adjacent each side of said trough;
 (e) aligning the first and second substrates in precise registration with their respective metallized front face surfaces;
 (f) bonding said metallized substrate surfaces together; and
 (g) etching sufficient unmetallized substrate surface areas from the metallized substrate region to relieve the metallized portion from the remaining substrate material, and leave a relieved, hollow microstructural cantilever beam.

30. The method of claim 29 including performing the additional step of depositing an etch stop on the reverse face surfaces of the respective substrates prior to step (e) in order to restrict the etching process in relieving the beam.

31. The method of claim 29 in which the substrate material is silicon.

32. The method of claim 29 in which the metal deposited is sintered to form a silicide layer.

33. The method of claim 29 in which the metal deposited is selected from the group consisting of tantalum, tungsten, chromium, molybdenum, nickel, platinum, titanium, beryllium, copper, and aluminum.

34. The method of claim 33 in which the metallization layer is sintered to form a silicide.

35. The method of claim 29 in which the joined substrate front face surfaces are bonded by electromigration.

36. The method of claim 29 in which the joined substrate front face surfaces are bonded by anodic bonding.

37. The method of claim 29 in which each trough is etched to a depth substantially within the range of $4 \times 10^{-7}$ meters and $2 \times 10^{-3}$ meters.

38. The method of claim 29 in which each trough is etched to a depth within the range of $5 \times 10^{-6}$ meters and $2 \times 10^{-5}$ meters.

39. A resonant hollow microstructural cantilever beam sensor element formed by the process of:
   (a) etching a trough in the front face surface of a first substrate;
   (b) etching a complementary trough in the front face of a second substrate;
   (c) depositing a conformal metallization layer over the substrate front face surface area, including the trough surfaces;
   (d) removing from the front face surface of each of the substrates a window area in the metallization layer adjacent each side of said trough;
   (e) aligning the first and second substrates in precise registration with their respective front face surfaces thereof joined;
   (f) bonding said metallized substrate surfaces together; and
   (g) etching sufficient unmetallized substrate surface areas from the metallized substrate region to relieve the metallized portion from the remaining substrate material, and leave a relieved, hollow microstructural cantilever beam.

40. A resonant hollow microstructural cantilever beam sensor element formed by the method of claim 39, and including performing the additional step of depositing an etch stop to the reverse face surfaces of the resective substrates prior to step (e) in order to restrict the etching process in relieving the beam.

41. The product according to claim 39 in which the metallization is sintered to form a silicide.

42. The product according to claim 39 in which the substrate material is silicon.

43. The product according to claim 39 in which the metal deposited is selected from the group consisting of tantalum, tungsten, chromium, molybdenum, nickel, platinum, beryllium, copper, and aluminum.

44. The product according to claim 39 in which the metal deposited is sintered to form a silicide layer.

45. The product according to claim 39 in which the joined front face substrate surfaces are bonded by electromigration.

46. The product according to claim 39 in which the hollow cavity beam element is formed of first and second metal portions and said base structure is formed of first and second base structure portions, said first metal beam portion and said first base portion being joined and said second metal beam portion and said second base portion being joined.

47. The product according to claim 39, further characterized in that the resonant hollow cavity beam element is polygonal having at least three sides.

48. The product according to claim 39, further characterized in that the resonant metal hollow cavity beam element is curvilinear in cross section.

49. The product according to claim 39, further characterized in that flat, integral metallic wing elements are formed along the sides of the resonant metallic hollow cavity beam.

50. The product according to claim 21 further including wing areas adjacent at least a portion of the length of the beam, said wing areas joining the beam horizontally to the base structure.

51. The product according to claim 21 further including a narrow strip area around the periphery of the beam at the juncture of the beam sidewalls where said beam sidewalls are joined from the substrate pieces.

52. A resonant hollow microstructural beam sensor element formed by the process of:
   (a) etching a trough in the front face surface of a first substrate;
   (b) etching a complementary-image trough in the front face surface of a second substrate;
   (c) depositing a conformal organic polymer layer over the substrate front surface area, including the trough surfaces;
   (d) removing from the front face surface of each of the substrates a window area in the polymer layer adjacent each side of said trough;
   (e) aligning the first and second substrates in precise registration with their respective front face surfaces joined;
   (f) bonding said organic polymer substrate surfaces together; and
   (g) etching sufficient substrate surface areas from the substrate region to relieve the organic polymer portion from the remaining substrate material, and leave a relieved, hollow microstructural cantilever beam.

53. The product according to the method of claim 52 wherein said polymer layer is a high molecular weight polymer.

54. A resonant hollow microstructural cantilever beam sensor element formed by the method of claim 52 and including performing the additional step of depositing an etch stop to the reverse face surface of the respective substrates prior to step (f) in order to restrict the etching process in relieving the beam.

* * * * *